(12) United States Patent
Karda et al.

(10) Patent No.: US 8,633,564 B2
(45) Date of Patent: Jan. 21, 2014

(54) SEMICONDUTOR ISOLATION STRUCTURE

(75) Inventors: Kamal Karda, Boise, ID (US);
Chandra Mouli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 4 days.

(21) Appl. No.: 13/310,145

(22) Filed: Dec. 2, 2011

(65) Prior Publication Data
US 2013/0140631 A1 Jun. 6, 2013

(51) Int. Cl.
*H01L 21/70* (2006.01)

(52) U.S. Cl.
USPC ............. 257/506; 257/E21.546; 257/E29.262

(58) Field of Classification Search
CPC .................. H01L 21/76264; H01L 21/763
USPC .......... 257/334, 296, 301, 302, 506, E21.546, 257/E29.262
See application file for complete search history.

(56) References Cited

U.S. PATENT DOCUMENTS

| 5,600,160 | A  | * | 2/1997 | Hvistendahl | 257/288 |
| 2004/0132232 | A1 | * | 7/2004 | Noble | 438/142 |
| 2005/0148118 | A1 | * | 7/2005 | Zheng et al. | 438/133 |
| 2007/0040200 | A1 | * | 2/2007 | Tran et al. | 257/296 |
| 2007/0096203 | A1 | * | 5/2007 | Mouli | 257/330 |

* cited by examiner

*Primary Examiner* — Nikolay Yushin
(74) *Attorney, Agent, or Firm* — Dickstein Shapiro LLP

(57) ABSTRACT

A method of formation of an isolation structure for vertical semiconductor devices, the resulting isolation structure, and a memory device to prevent leakage among adjacent vertical semiconductor devices are described.

52 Claims, 22 Drawing Sheets

SEMICONDUTOR ISOLATION STRUCTURE

TECHNICAL FIELD

Embodiments of the invention relate to isolation structures for semiconductor devices, and more particularly, to isolation structures for vertically constructed semiconductor devices.

BACKGROUND OF THE INVENTION

Many electronic devices, such as personal computers, workstations, computer servers, mainframes and other computer related equipment such as printers, scanners and hard disk drives use memory devices that provide substantial data storage capability, while incurring low power consumption. One type of memory device that is well-suited for use in such devices is dynamic random access memory (DRAM).

Generally, DRAM includes a memory array having a plurality of memory cells that can be arranged in rows and columns. Conductive word lines may be positioned along the rows of the array to couple cells in respective rows, while conductive bit lines may be positioned along columns of the array and coupled to cells in the respective columns. The memory cells in the array may include an access device, such as a transistor device, and a storage device, such as a capacitor. The access device and the storage device may be coupled so that information is stored within a memory cell by imposing a predetermined charge state (corresponding to a selected logic level) on the storage device, and retrieved by accessing the charge state through the access device. Since the charge state in the storage device typically dissipates due to leakage from the cell, the storage device within each memory cell may be periodically refreshed. Current leakage from the cells in the DRAM may occur along several different paths, and if the current leakage is excessive, then the cell refresh interval may be relatively short, which can adversely affect access time for the memory device, and increase the amount of power consumed.

As the cell density of memory devices increases, semiconductor devices, such as access devices, that are vertically disposed in a supporting substrate are increasingly favored. Although a vertical semiconductor device has a reduced footprint when compared to a laterally-disposed device, electrical device isolation presents a concern with ever increasing packing densities.

DETAILED DESCRIPTION OF THE INVENTION

In the following detailed description, reference is made to the accompanying drawings, which form a part hereof and illustrate specific embodiments of the invention. These embodiments are described in sufficient detail to enable those skilled in the art to make and use them. It is to be understood that structural, logical, or procedural changes may be made to the specific embodiments disclosed without departing from the spirit and scope of the invention.

The term "substrate" includes silicon, silicon-on-insulator (SOI) or silicon-on-sapphire (SOS), doped and undoped semiconductors, epitaxial layers of silicon supported by a base semiconductor foundation, and other semiconductor structures. Furthermore, when reference is made to a "substrate" in the following description, previous process steps may have been utilized to form regions, junctions or material layers in or on the base semiconductor structure or foundation. In addition, the semiconductor need not be silicon-based, but could be based on silicon-germanium, germanium, gallium arsenide, or other known semiconductor materials.

Embodiments described herein provide an isolation structure suitable for isolating vertical semiconductor devices. One example is a vertical access device that may be used in a memory product. However, the described embodiments are not limited to memory products, even though a memory product is described herein a providing a context for the invention.

Figure 1:
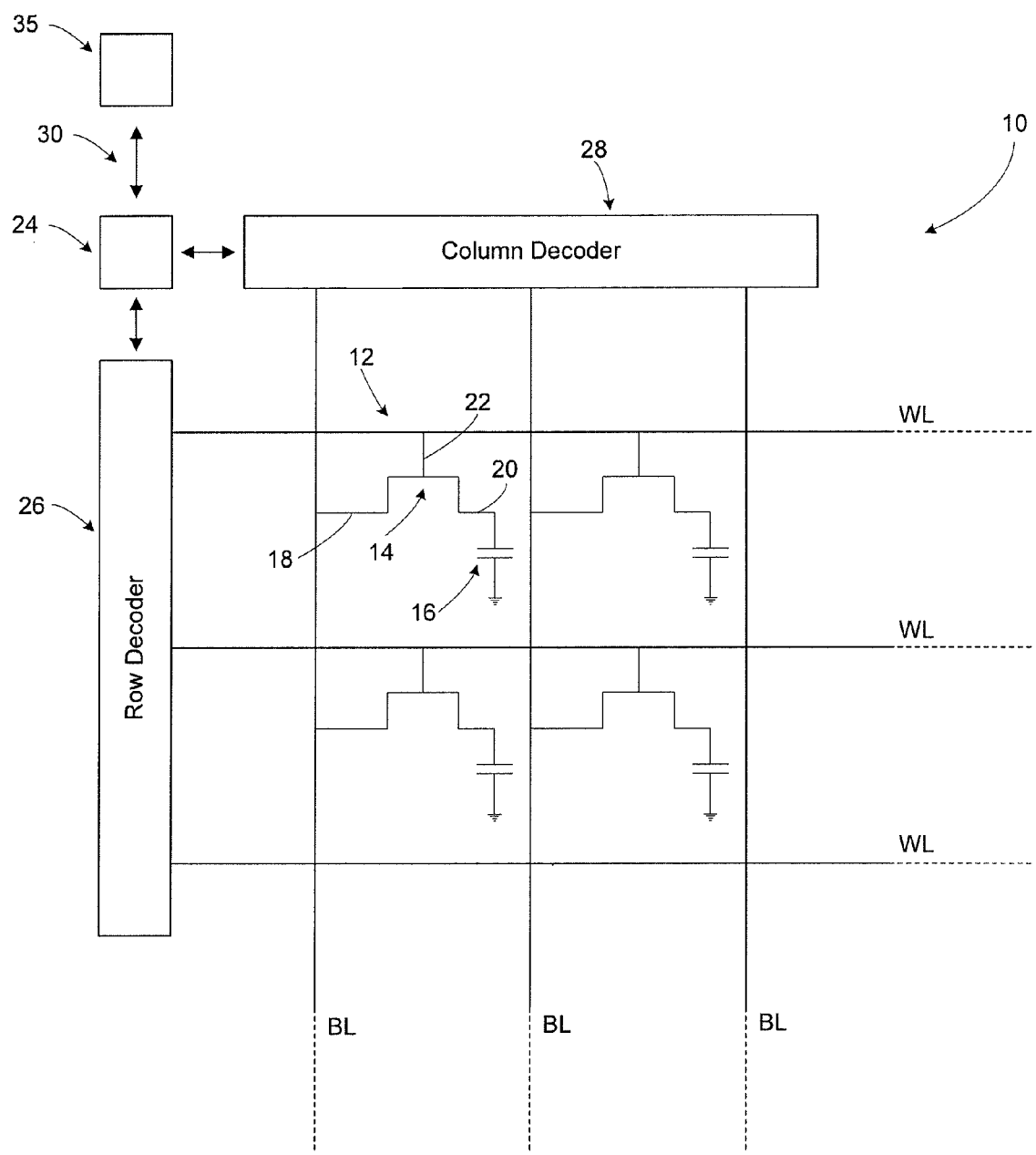
FIG. 1 is a circuit schematic of a partial memory device and processing system according to a disclosed embodiment.

FIG. 1 is a partial schematic illustration of a memory device 10, incorporating an array of memory elements 12. The memory device 10 may be a DRAM device, for example, although the embodiments described herein are not limited to DRAM or even memory devices. Memory device 10 includes a number of memory elements 12 arranged in a grid pattern comprising a number of rows and columns. As can be appreciated, the number of memory elements 12 (and corresponding rows and columns) may vary depending on system requirements and fabrication technology. Each memory element 12 includes an access device 14 and a storage device 16. In this exemplary embodiment, the access device 14 comprises a transistor and the storage device 16 comprises a capacitor. The access device 14 provides controlled access to the storage device 16. The access device 14 includes a source terminal 18, a drain terminal 20, and a gate terminal 22 for controlling conduction between the source and drain terminals 18, 20. The storage device 16 is coupled between one of the source/drain terminals 18, 20 and a reference voltage (illustrated as a ground potential).

As is known in the art, an electrical charge is placed on the source 18 of the access device 14 via a corresponding bit line (BL). By controlling the voltage at the gate 22 via the word line (WL), a voltage potential may be created across the access device 14 such that the electrical charge at the source 18 can flow to or from the storage device 16.

The bit lines BL are used to read from and write data to the memory elements 12. The word lines WL are used to activate the access device 14 to access a particular row of memory elements 12. The memory device 10 includes an address buffer 24, a row decoder 26, and column decoder 28 to control the word lines WL and bit lines BL. The address buffer 24 controls the row decoder 26 and the column decoder 28 such that the row decoder 26 and column decoder 28 selectively access memory elements 12 in response to address signals 30 provided during read and write operations. The address signals 30 are typically provided by an external controller 35 such as a microprocessor or other memory controller. The column decoder 28 may also include sense amplifiers and input/output circuitry to further enable data to be read from and written to the memory elements 12 via the bit lines BL.

Figure 2:
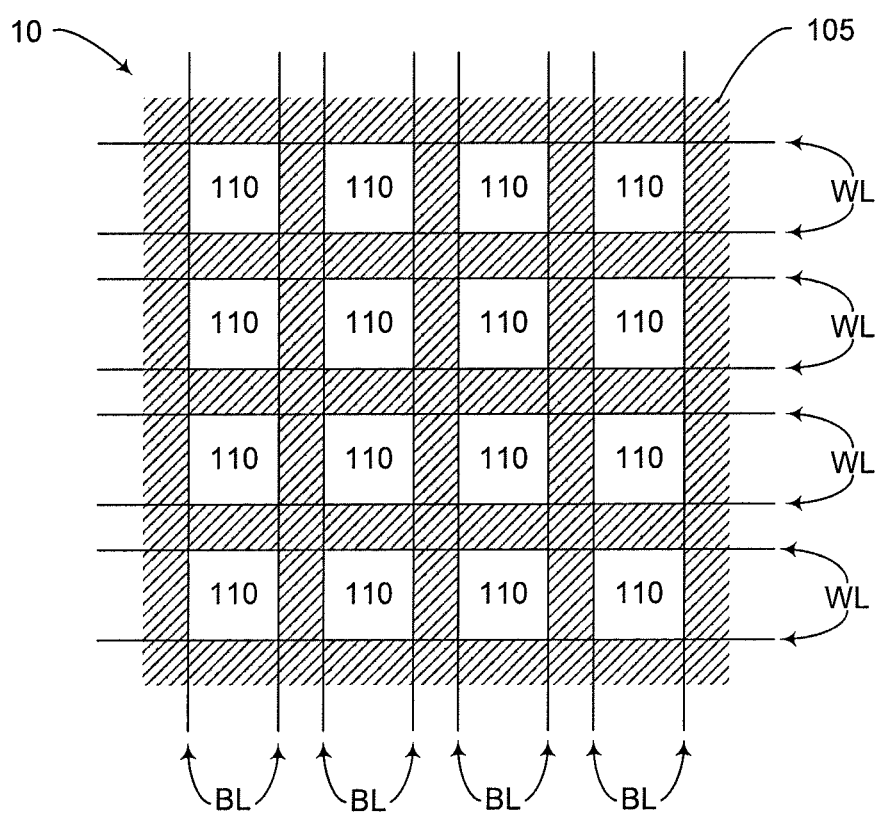
FIG. 2 is a top view of a vertical access device according to a disclosed embodiment.

FIG. 2 illustrates the FIG. 1 memory device 10 showing vertical access devices 110 from a top view. As can be seen, the memory device 10 may be implemented with an array of vertical access devices 110 that are coupled by access lines, for example word lines (WL), connected to the gates of the access devices 110, in rows and coupled by data/sense lines, for example bit lines (BL), connected to the source/drain regions, in columns. Between each row and column of access devices 110, an isolation region 105 is provided to isolate access devices 110 and reduce leakage among the access devices 110 and from the access devices 110 to the substrate. As is understood, the word lines (WL) and bit lines (BL) are provided at different vertical elevations of the access devices 110.

In high density arrays it becomes increasingly difficult to prevent source/drain leakage from a vertical access device to the semiconductor substrate and device to device leakage due to band-band and trap assisted band-band tunneling. Embodiments described herein provide an isolation structure which reduces leakage from vertical access devices to the substrate without affecting leakage from one vertical access device to adjacent vertical access devices. Fabrication of such an isolation structure is now described with reference to FIGS. 3-22.

Figure 3:
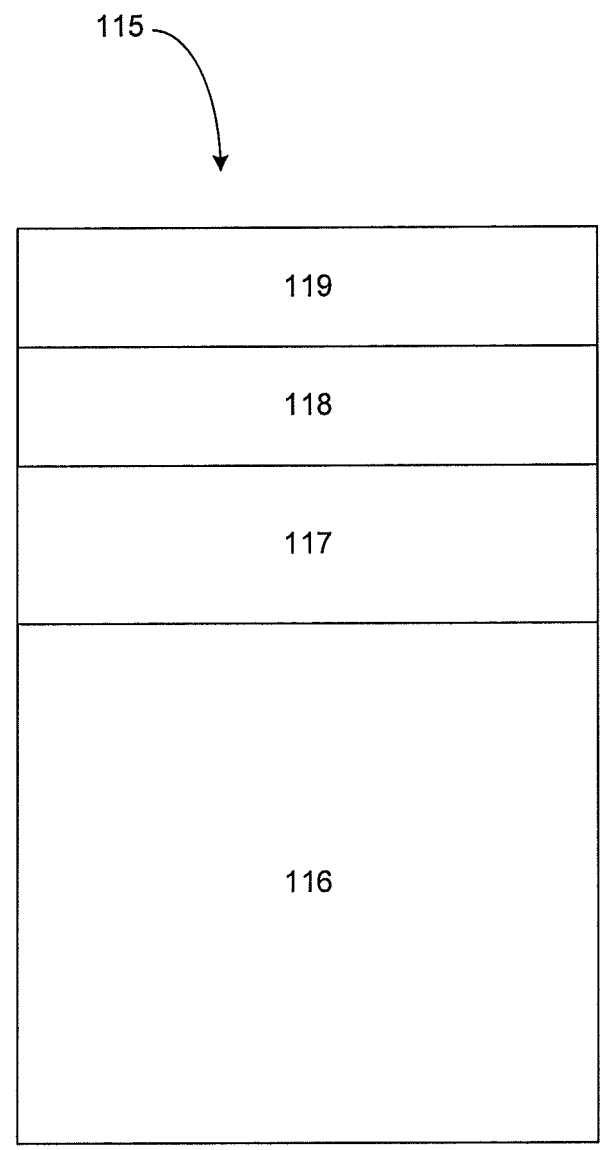
FIG. 3 is a step in the fabrication of memory elements according to a disclosed embodiment.

As is shown in the cross section of FIG. 3, a semiconductor substrate 115 is provided with a P-type doped first semiconductor region 116, an overlying second semiconductor region 117 doped to an opposite conductivity type, a third semiconductor region 118 doped with a P-type conductivity, and fourth semiconductor region 119 doped with an N-type conductivity. In one embodiment, the semiconductor region 117 is an N-type doped semiconductor substrate, although, the second semiconductor region 117 may be doped to a higher concentration of dopant (e.g. N+ or N++ type). As should be appreciated, while semiconductor regions 116, 117, 118, 119 are described as being formed of either N-type or P-type conductivities, in other embodiments the semiconductor regions 116, 117, 118, 119 may be formed of materials of an opposite conductivity type as that described.

Figure 4:
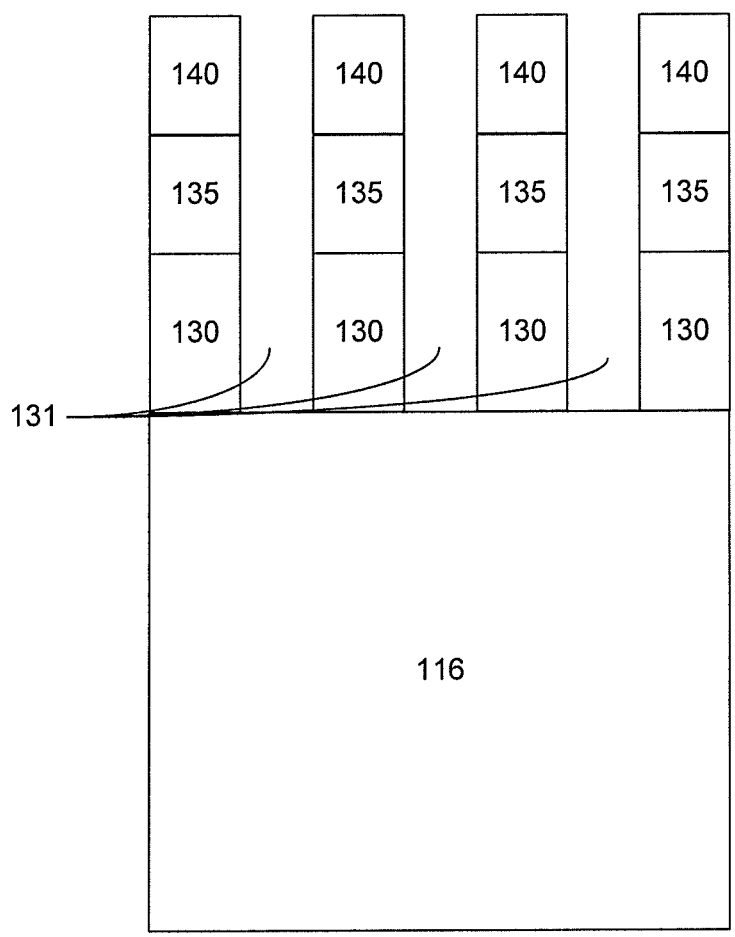
FIG. 4 is a step in the fabrication of memory elements according to a disclosed embodiment after FIG. 3.
Figure 5:
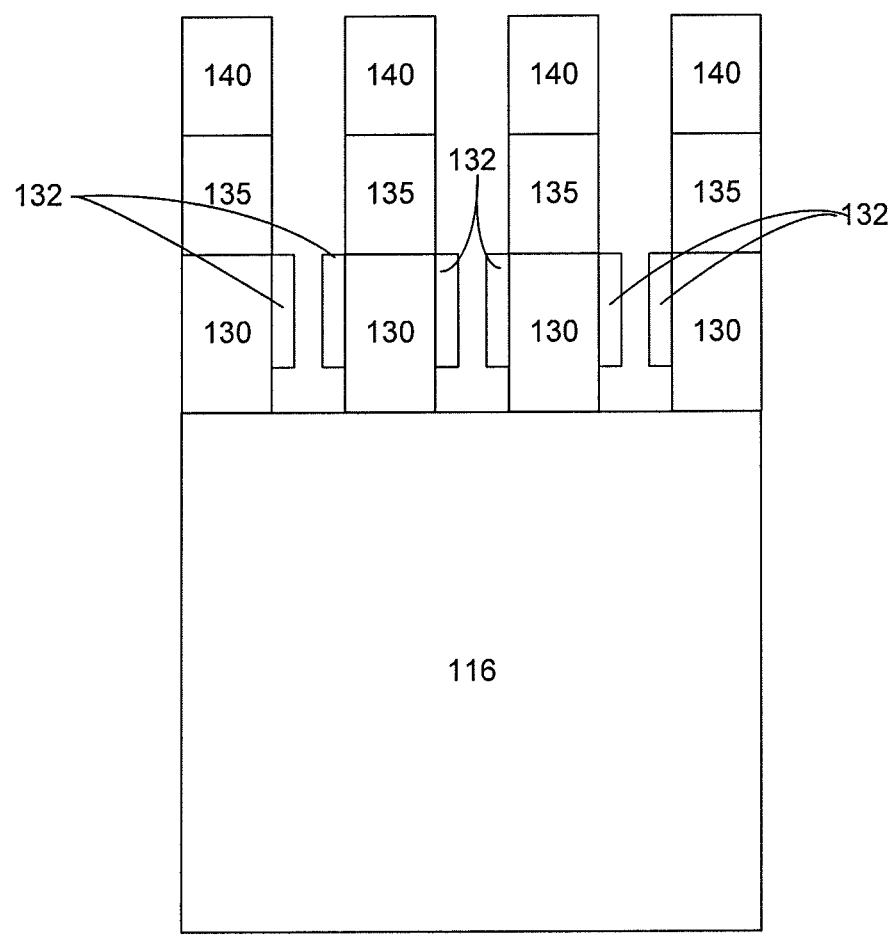
FIG. 5 is a step in the fabrication of memory elements according to a disclosed embodiment after FIG. 4.

The second semiconductor region 117, third semiconductor region 118, and fourth semiconductor region 119 are then etched to form trenches 131 between N-type semiconductor access device regions 130, 140 and P-type semiconductor access device regions 135, as is shown in FIG. 4. Next, as is shown in FIG. 5, bit lines 132 are provided in the trenches 131 along each side of the access device regions 130. In another embodiment, the bit lines 132 may be provided only along one side of the access device regions 130. As is also shown in FIG. 5, the bit lines 132 are formed so that the bottoms of the bit lines 132 do not contact the first semiconductor region 116. The bit lines 132 may be formed of any suitable bit line material known in the art including titanium nitride (TiN).

Figure 6:
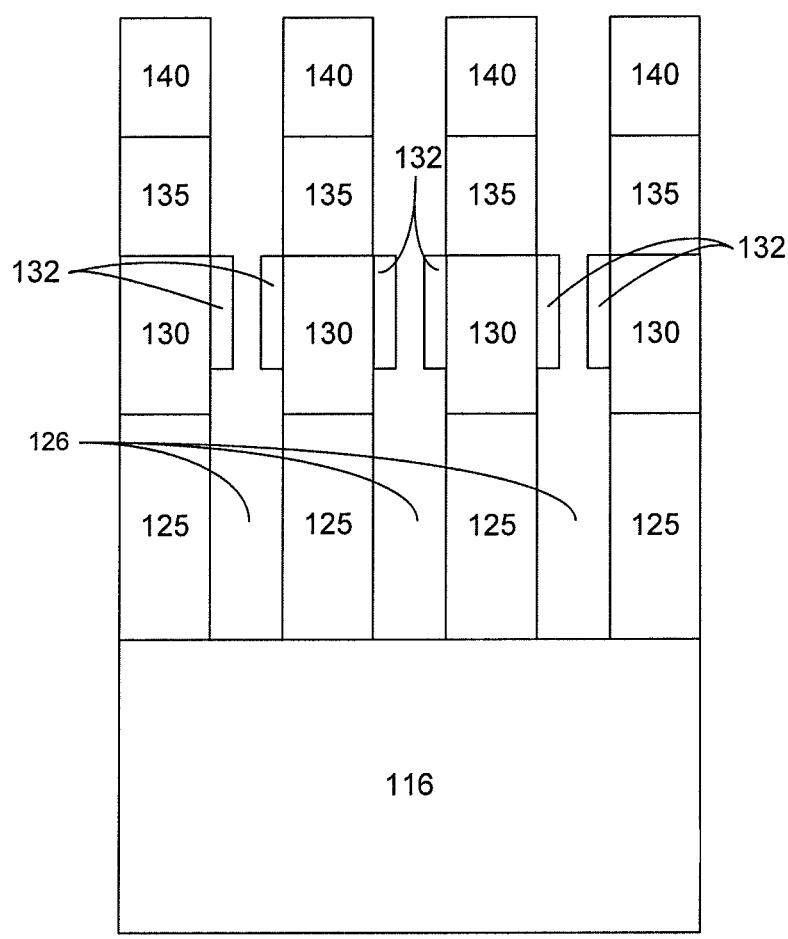
FIG. 6 is a step in the fabrication of memory elements according to a disclosed embodiment after FIG. 5.

As is shown next in FIG. 6, the first semiconductor region 116 is etched to create trenches 126 between adjacent access device regions 130 and to provide P-type semiconductor isolation regions 125 below the access device regions 130. In one embodiment, the trenches 126 are etched to the maximum depth permitted by the aspect ratio of the device. After the first semiconductor region 116 is etched to form the semiconductor isolation regions 125, the semiconductor isolation regions 125 may be subjected to further P-type implantation to more heavily dope the P-type semiconductor isolation regions 125. The dopant may be implanted through the semiconductor access device regions 130, 135, 140, implanted into the first semiconductor region 116 at the bottom of the trenches 126 from where it diffuses up into the semiconductor isolation regions 125, or implanted through other techniques known in the art. With the additional doping, the semiconductor isolation regions 125 will become P+ doped regions while the first semiconductor region 116 remains doped P-type.

Figure 7:
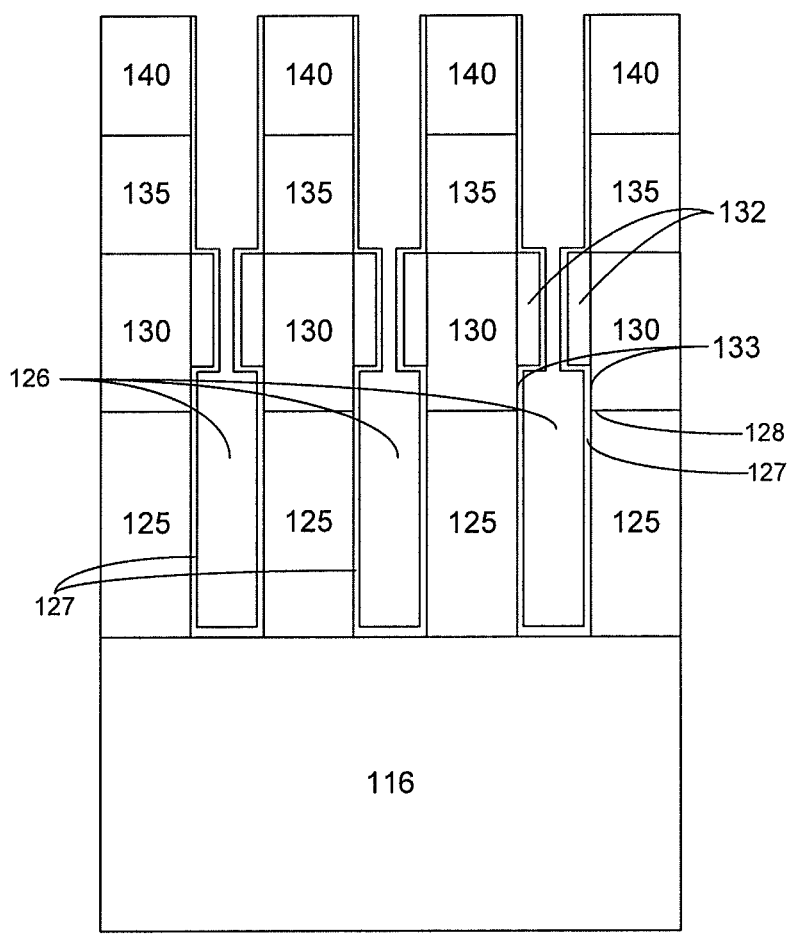
FIG. 7 is a step in the fabrication of memory elements according to a disclosed embodiment after FIG. 6.

Next, as is shown in FIG. 7, a dielectric liner material 127 is provided along the sidewalls and bottom of the trenches 126 and on the bit lines 132. The dielectric liner material 127 may be silicon nitride (Si3N4), silicon dioxide (SiO2), silicon oxynitride (SiOxNy) or another suitable dielectric material that provides a fixed positive interface charge at the interface of the dielectric liner material and semiconductor material. In one embodiment, the dielectric liner material may be formed with a thickness of from between 20 and 50 Å. In the embodiment shown in FIG. 7, the dielectric liner material 127 is provided along both the side of the semiconductor isolation regions 125, the bit lines 132, the semiconductor access device regions 135, 140, and the exposed portions 133 of the semiconductor access device regions 130 and first semiconductor region 116. Since the bit lines 132 are spaced away from the first semiconductor region 116, the dielectric liner material 127 covers the junction 128 between the semiconductor isolation regions 125 and the access device regions 130.

Figure 8:
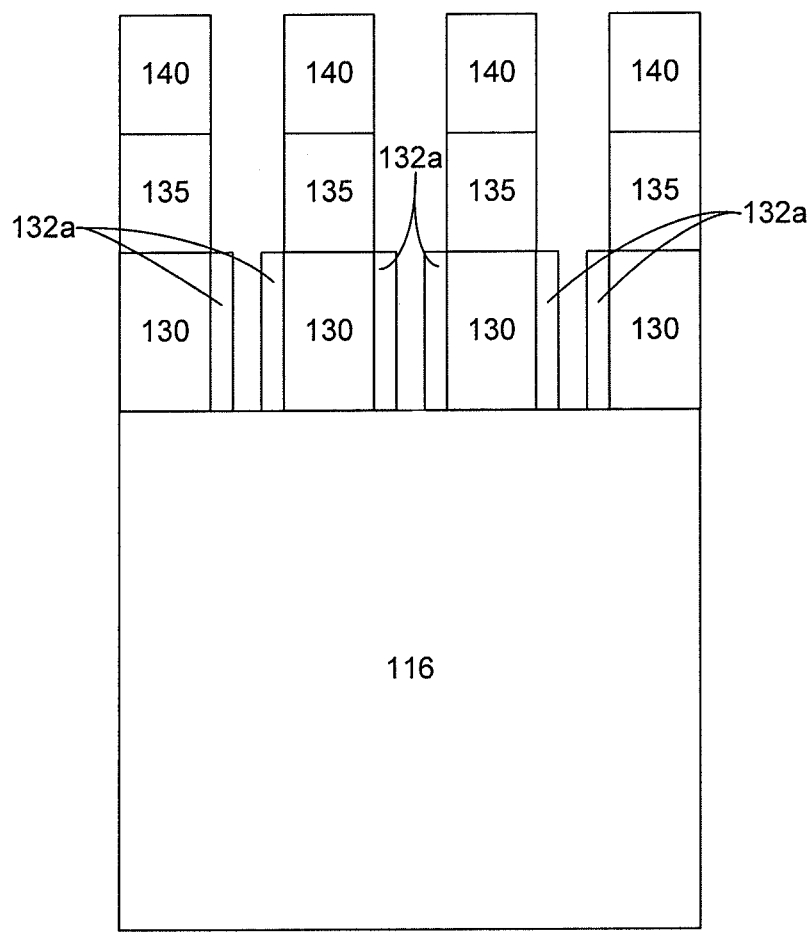
FIG. 8 is a step in the fabrication of memory elements according to a disclosed embodiment after FIG. 4.
Figure 9:
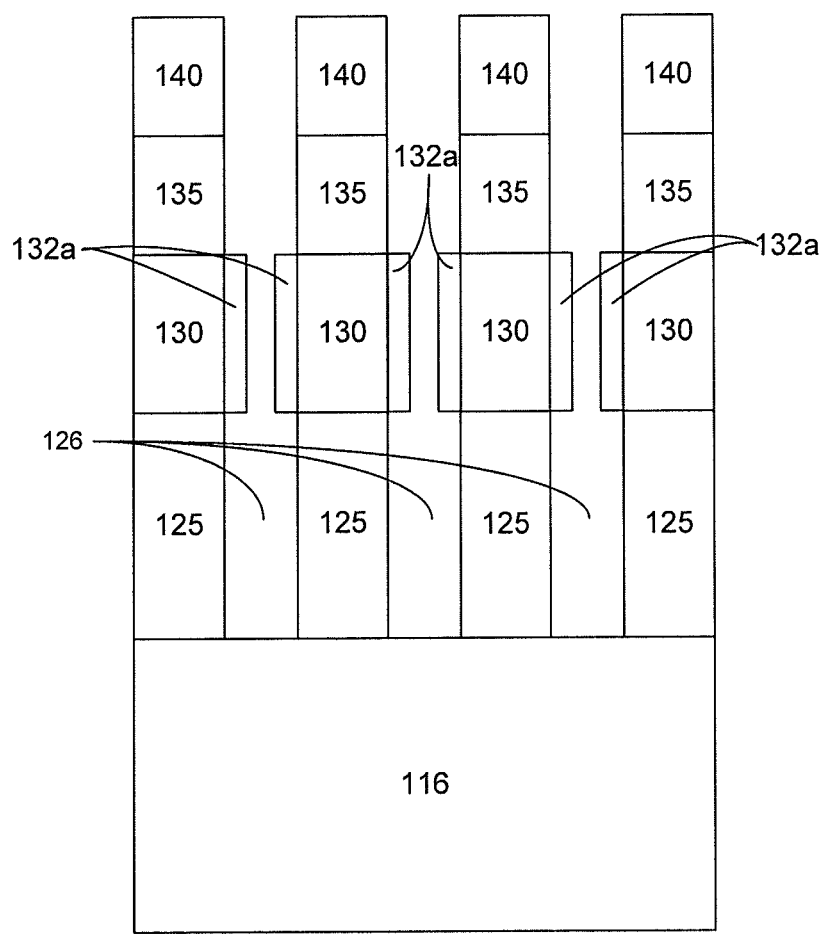
FIG. 9 is a step in the fabrication of memory elements according to a disclosed embodiment after FIG. 8.
Figure 10:
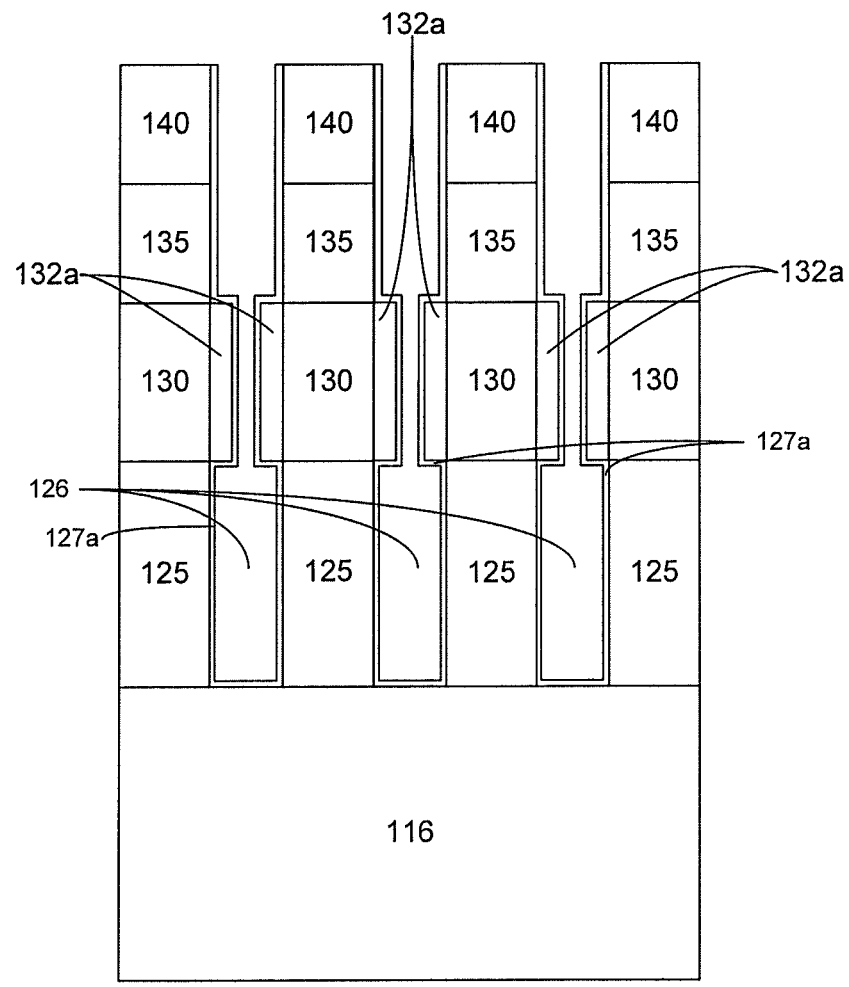
FIG. 10 is a step in the fabrication of memory elements according to a disclosed embodiment after FIG. 9.

In another embodiment, the bit lines 132*a* are formed as shown in FIG. 8 such that each bit line 132*a* contacts the first semiconductor region 116. The first semiconductor region 116 is then etched, as shown in FIG. 9, to form semiconductor isolation regions 125 such that no portions of the semiconductor access device regions 130 are exposed. The dielectric liner material 127*a* is provided in the sidewalls and bottom of the trenches 126, as shown in FIG. 10. By lining the trenches 126 as shown in FIG. 10, no portion of the access device regions 130 are coated with the dielectric liner material 127*a*.

Figure 11:
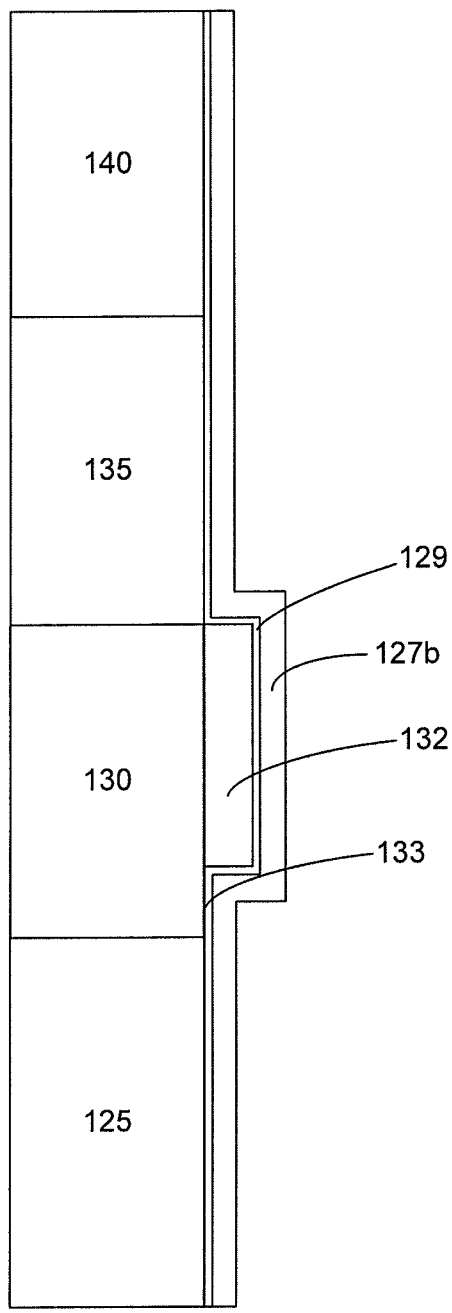
FIG. 11 is a close-up partial view of an access device according to a disclosed embodiment.

In another embodiment, shown in FIG. 11 in an up-close, cross-sectional view of the bit line 132, semiconductor isolation region 125, and semiconductor access device regions 130, 135, 140 of FIG. 7, an intermediary material 129 may be formed adjacent to the bit line 132, semiconductor isolation region 125, and semiconductor access device regions 130, 135, 140 to facilitate deposition of the dielectric liner material 127b to the bit line 132 semiconductor isolation region 125, and semiconductor access device regions 130, 135, 140 and provide a higher quality interface between the dielectric liner material 127b and the bit line 132, semiconductor isolation region 125, and semiconductor access device regions 130, 135, 140. In another embodiment, the intermediary material may only be provided on the semiconductor isolation region 125 and the exposed portion 133 of the semiconductor access device region 130. The intermediary material 129 may be formed of silicon dioxide (SiO2), hafnium oxide (HfO2) or other suitable materials to facilitate the adhesion of the dielectric liner material 127b. In one embodiment, the intermediary material 129 is less than about 10 Å thick.

Figure 12:
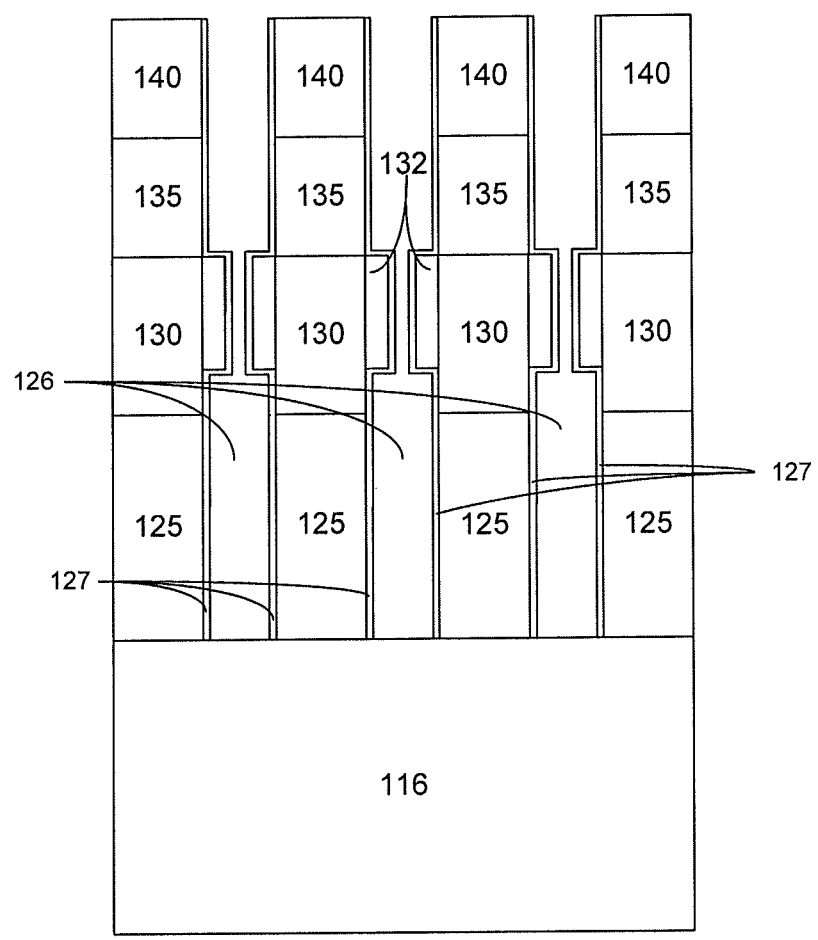
FIG. 12 is a step in the fabrication of memory elements according to a disclosed embodiment after FIG. 7.
Figure 13:
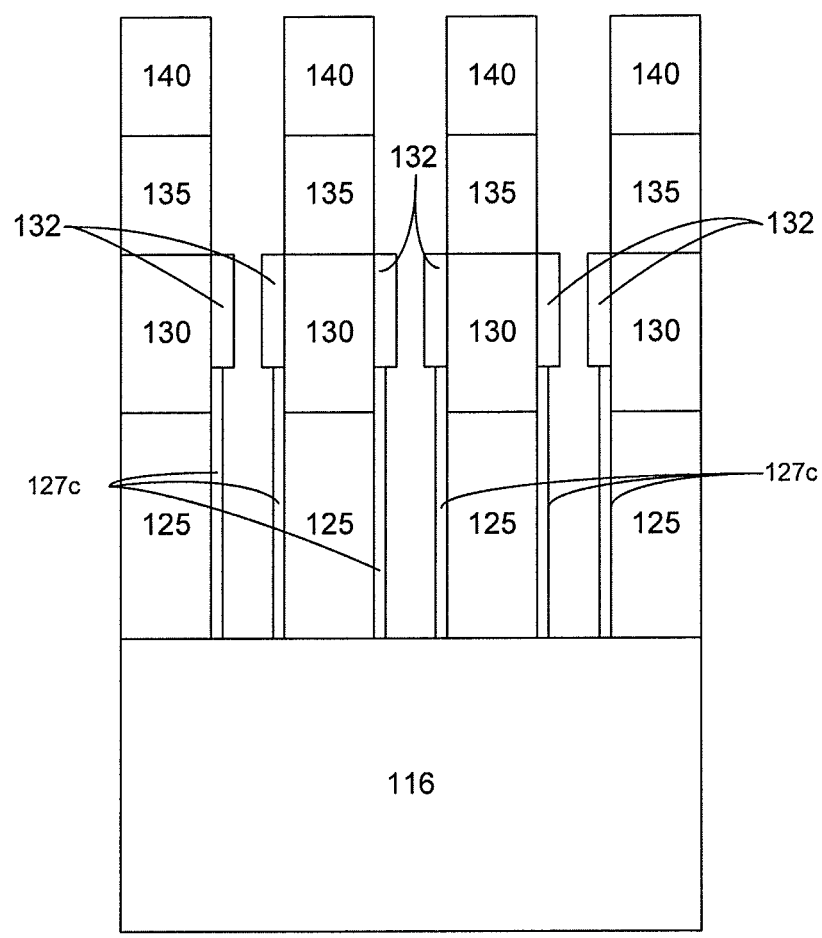
FIG. 13 is a step in the fabrication of memory elements according to a disclosed embodiment after FIG. 6.

After the dielectric liner material 127 has been deposited, the dielectric liner material 127 is etched from the bottom of the trenches 126 to expose the first semiconductor region 116, as shown in FIG. 12. In one embodiment, an anisotropic etch is utilized to ensure that the dielectric liner material 127 extends the entire height of the semiconductor isolation region 125 from the upper extent of the semiconductor region 140 to the surface of the first semiconductor region 116. As is shown in FIG. 13 in alternative embodiments, the dielectric liner material 127c may be deposited such that it does not cover the bit lines 132 or the semiconductor regions 135, 140, by, for example, omitting the intermediary material 129. In the alternative, the dielectric liner material 127c may also be etched from the bit lines 132 using the same anisotropic etch discussed above, which removes the dielectric liner material 127 from the bottom of trenches 126, or with the use of a second etching.

Figure 14:
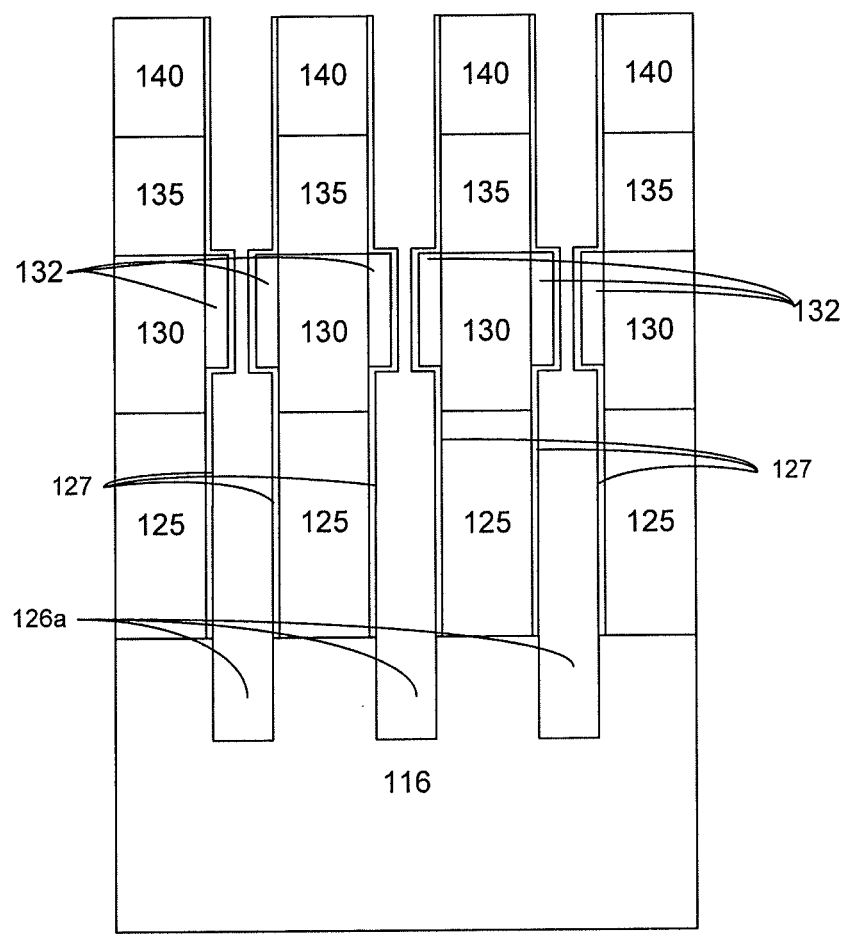
FIG. 14 is a step in the fabrication of memory elements according to a disclosed embodiment after FIG. 12.

Next, as is shown in FIG. 14, the first semiconductor region 116 is further etched to deepen the trenches 126, now 126a. In one embodiment, the etching is an anisotropic etching as is shown in FIG. 14. In another embodiment, an isotropic etching may be utilized to extend the trench 126b beneath the semiconductor isolation regions 125 as shown in FIG. 15.

Figure 16:
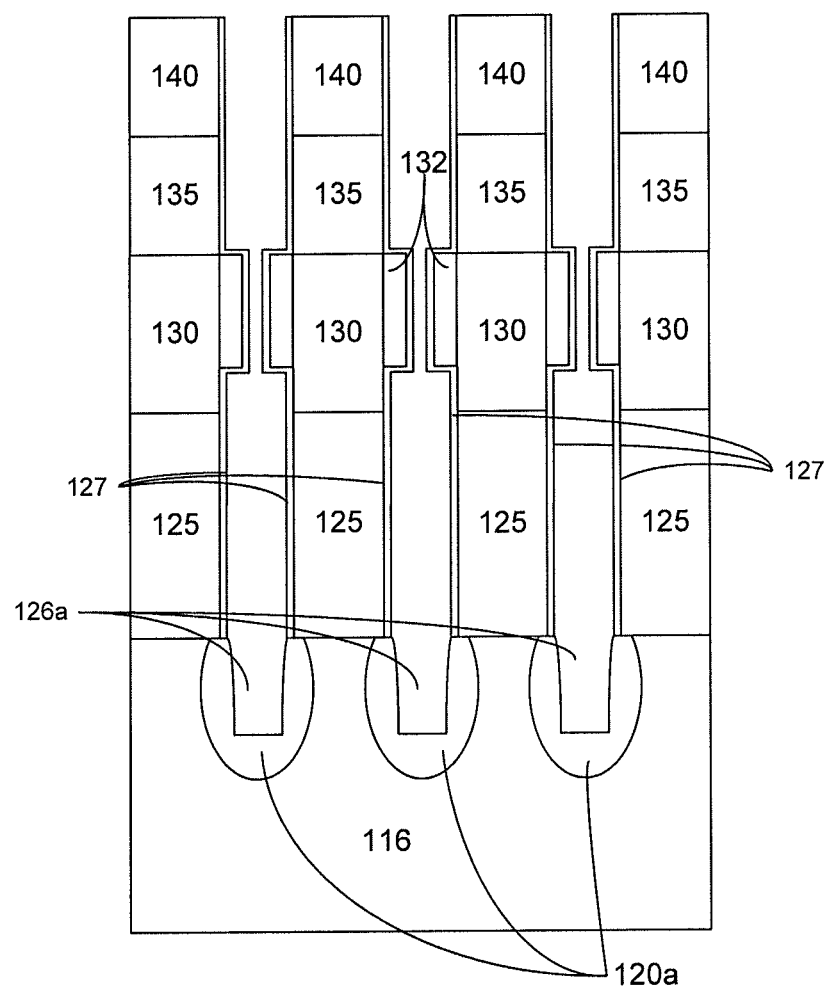
FIG. 16 is a step in the fabrication of memory elements according to a disclosed embodiment after FIG. 14.
Figure 17:
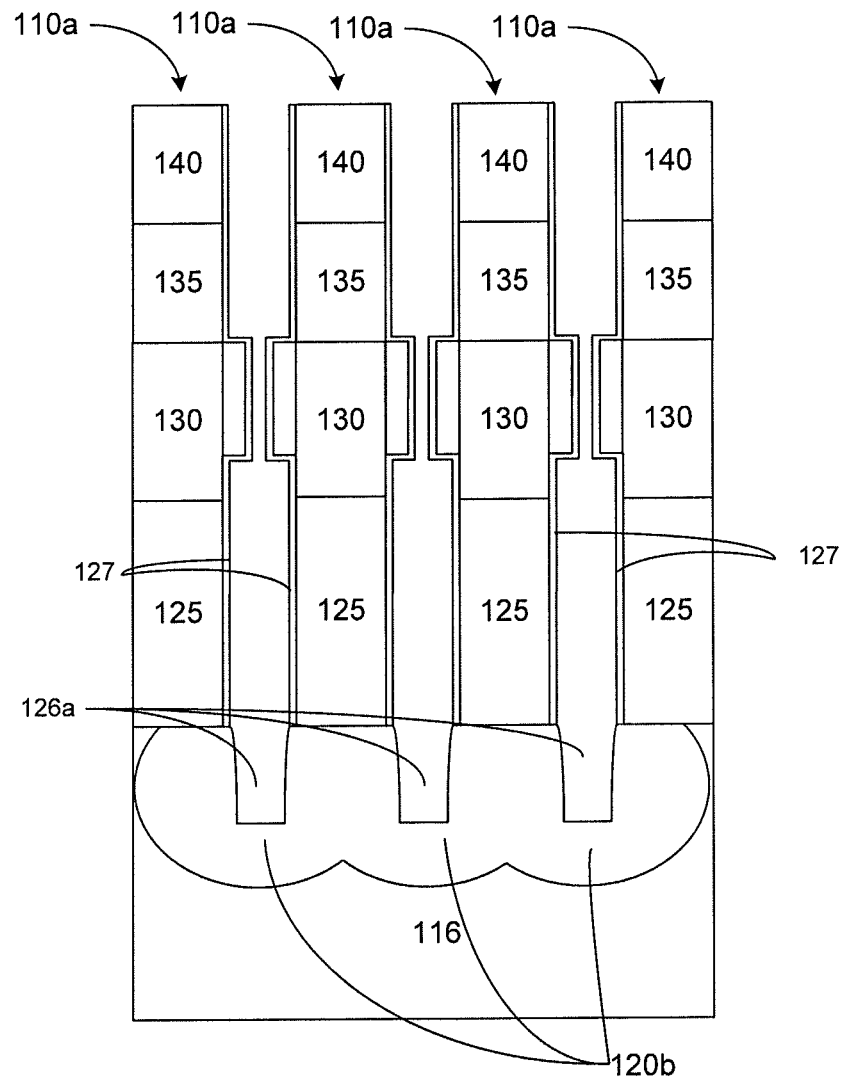
FIG. 17 is a step in the fabrication of memory elements according to a disclosed embodiment after FIG. 14.

Next, the bottom of the trench 126a is oxidized to create a silicon dioxide isolation region 120a, as shown in FIG. 16. The silicon dioxide isolation region 120a may be created through thermal oxidization or other suitable oxidization techniques. In the embodiment shown in FIG. 16, the silicon dioxide isolation region 120a does not extend completely beneath the semiconductor isolation regions 125. However, in another embodiment, shown in FIG. 17, the silicon dioxide isolation region 120b may be formed such that adjacent silicon dioxide isolation region 120b connect to further reduce band-band leakage from the partially-completed vertical access devices 110a to the substrate 115.

Figure 15:
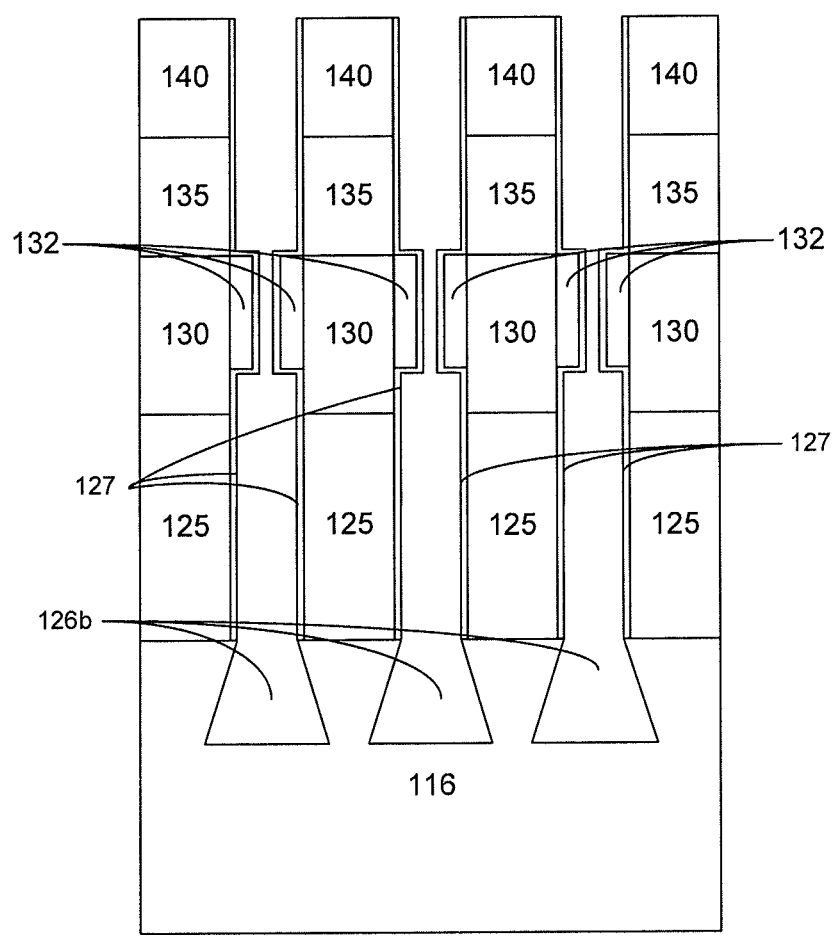
FIG. 15 is a step in the fabrication of memory elements according to a disclosed embodiment after FIG. 12.
Figure 18:
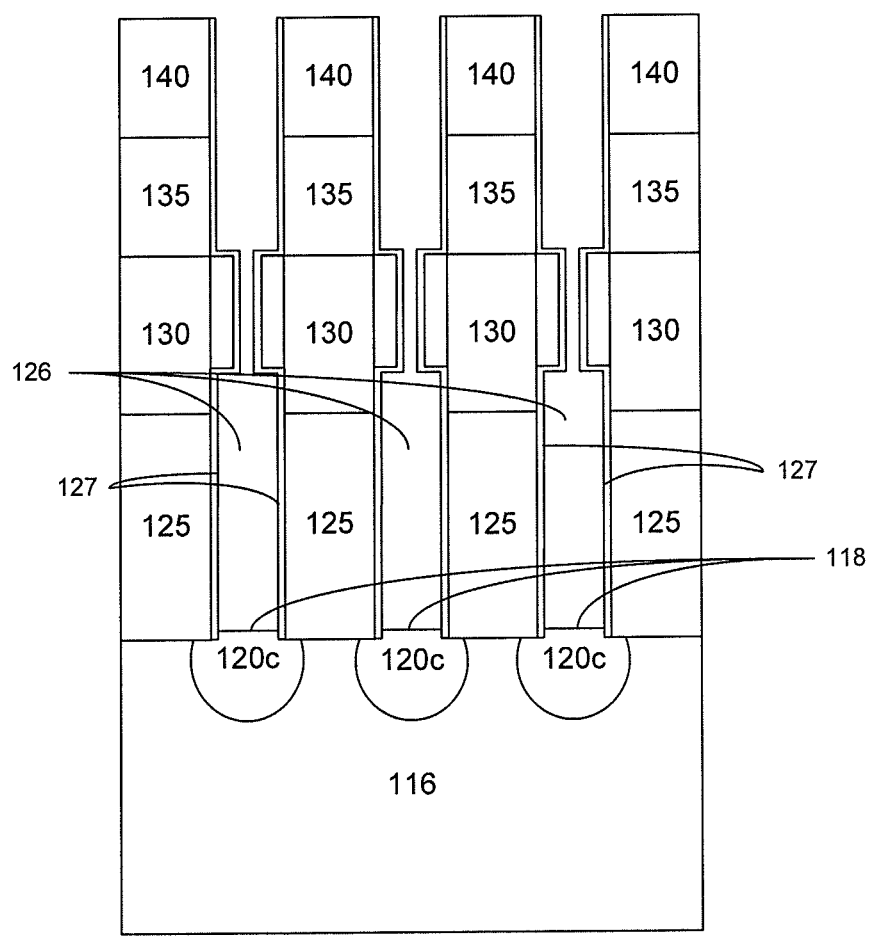
FIG. 18 is a step in the fabrication of memory elements according to a disclosed embodiment after FIG. 12.

In an alternative embodiment, the first semiconductor region 116 is not etched further, as was shown in FIGS. 14 and 15. Instead, the exposed surface 118 of the first semiconductor region 116 at the bottom of the trenches 126 in FIG. 13 may be oxidized to create oxidation regions 120c as is shown in FIG. 18.

Figure 19:
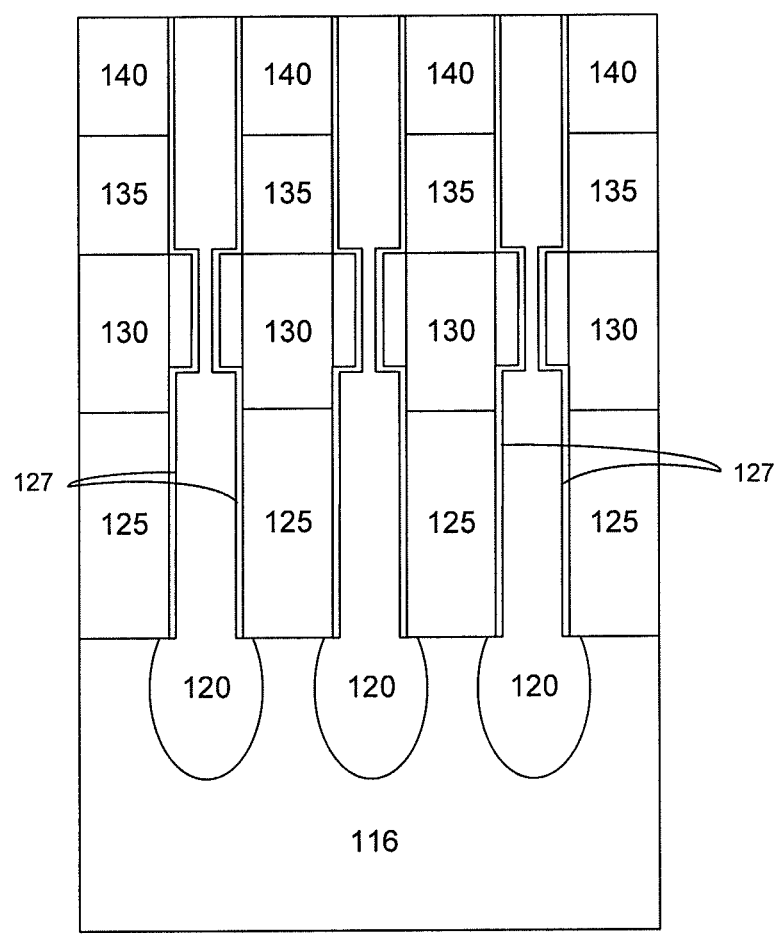
FIG. 19 is a step in the fabrication of memory elements according to a disclosed embodiment after FIG. 16.
Figure 20:
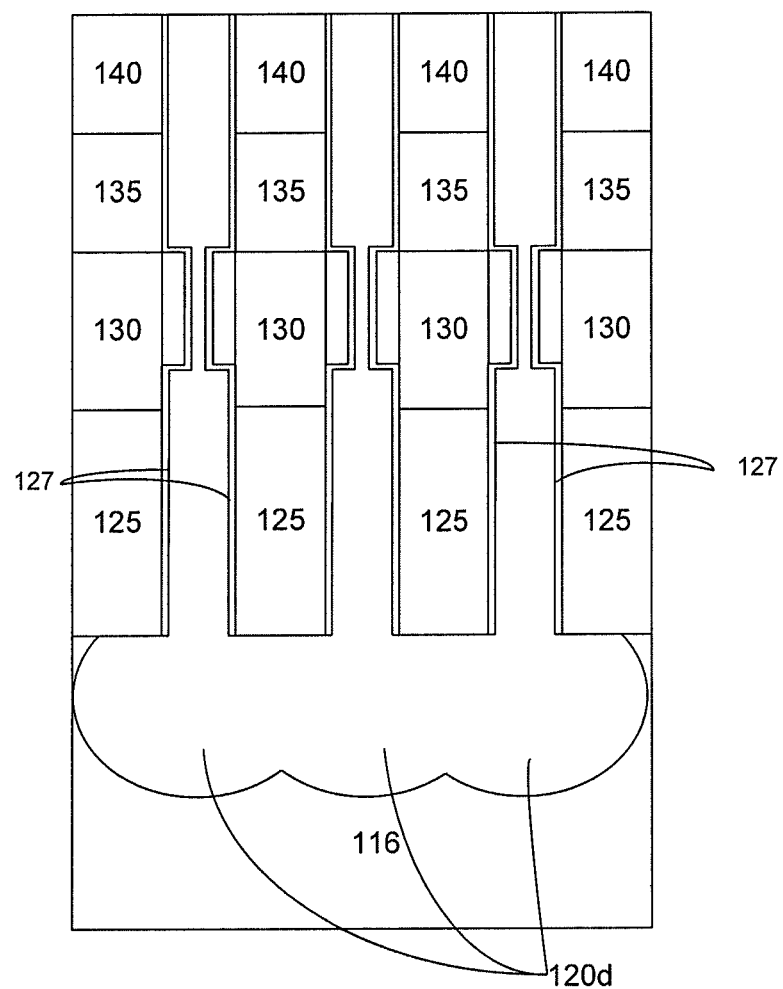
FIG. 20 is a step in the fabrication of memory elements according to a disclosed embodiment after FIG. 17.
Figure 21:
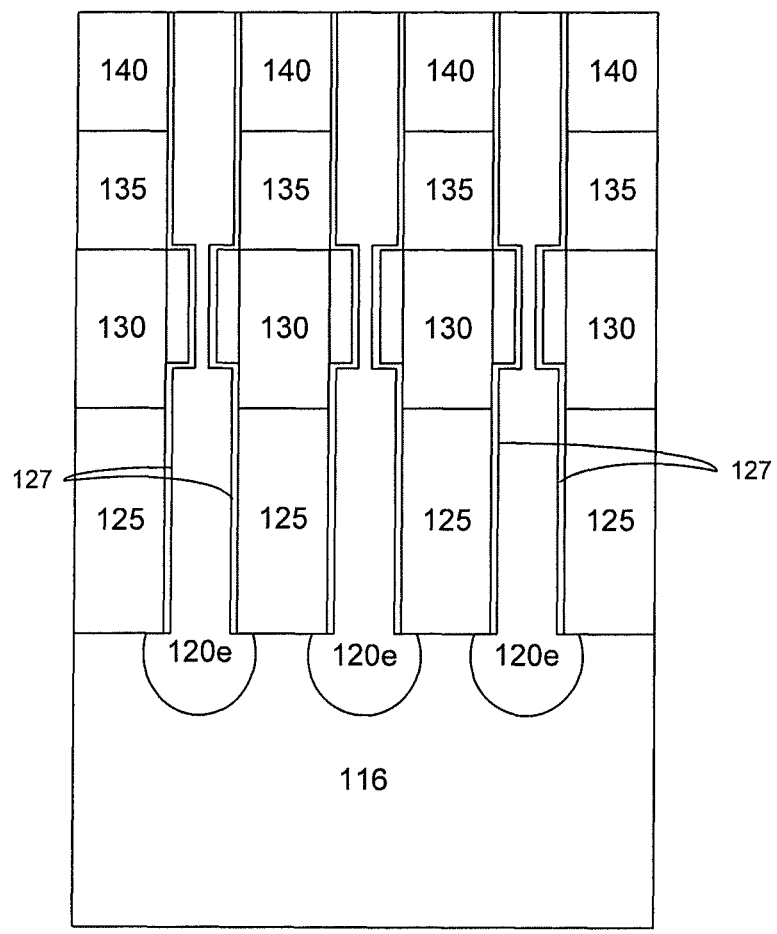
FIG. 21 is a step in the fabrication of memory elements according to a disclosed embodiment after FIG. 18.

Next, as illustrated in FIG. 19, the trenches 126a of FIG. 16 are filled with a dielectric material, to the extent the grown oxide does not fill the trenches, creating an isolation region 120. In other embodiments shown in FIGS. 20 and 21, the trenches 126a of FIG. 17 or trenches 126 of FIG. 18 could also be filled with dielectric material creating isolation regions 120d, 120e as was shown in FIG. 16. The dielectric material may be applied by any suitable technique including spin coating, blanket coating, chemical vapor deposition (CVD), plasma enhanced CVD, atomic layer deposition (ALD), plasma enhanced ALD, or physical vapor deposition (PVD). The dielectric material may be formed from any suitable material including oxides, nitrides, or combinations thereof.

Figure 22:
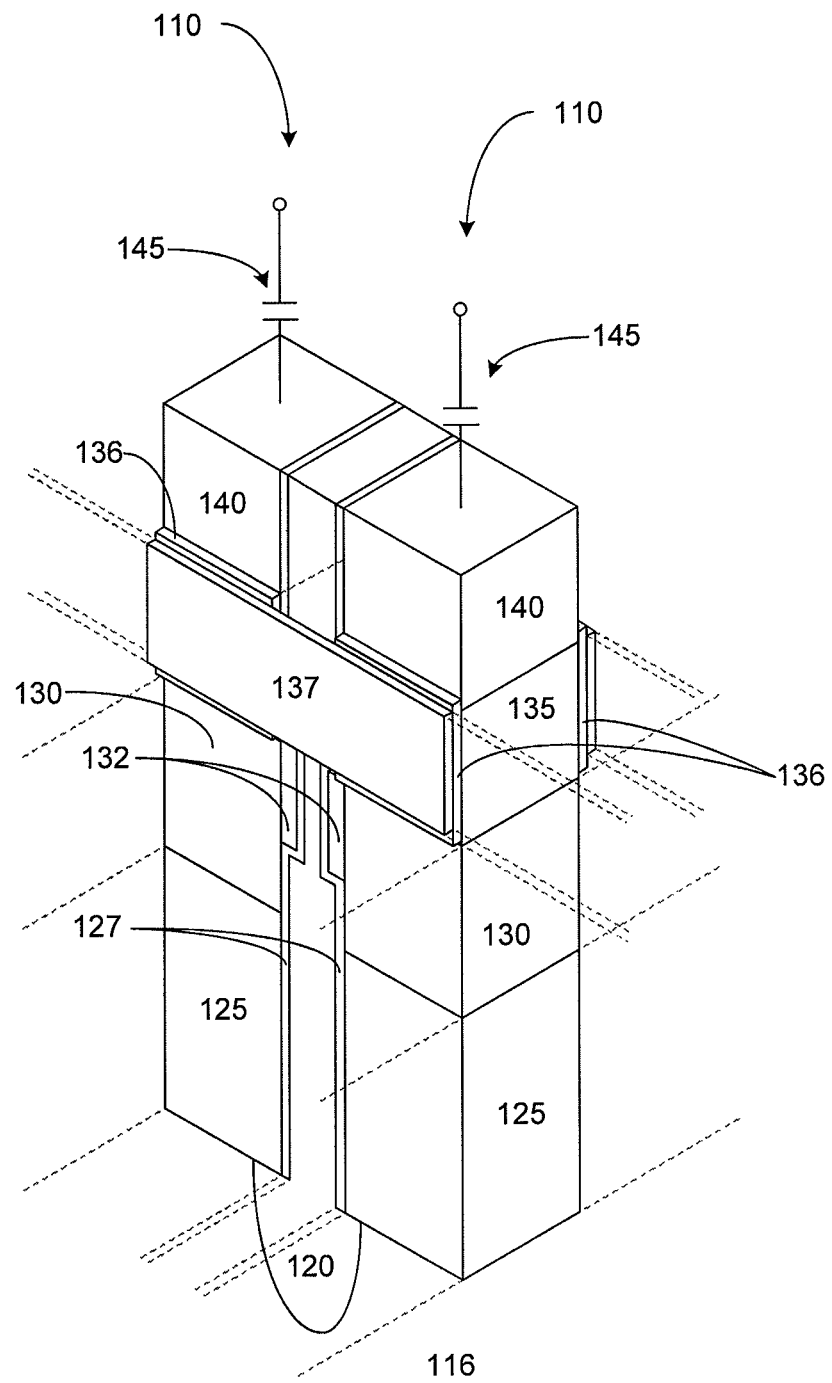
FIG. 22 is a completed vertical access device and associated storage device according to a disclosed embodiment.

FIG. 22 shows a perspective view of the completed vertical access device 110, here a vertical MOSFET, completed using techniques known in the art once the isolation regions 120 are formed and the top surface of the FIG. 19 structure is planarized. Trenches are formed perpendicular to the bit lines 132 to the depth even with the top of the semiconductor regions 130 to allow for formation of the gate oxide elements 136 and word lines 137. Gate oxide elements 136 are provided adjacent each second access device region 135. In the embodiment shown in FIG. 22, a gate oxide element 136 is provided on each side of the second access device region 135. In a second embodiment, only one gate oxide element 136 is provided adjacent each second access device region 135. A word line 137 is provided over the associated gate oxide element 136 to form a transistor gate. As was shown and described above with respect to FIG. 1, the first and third access device regions 130, 140 act as source/drain regions for the associated access device 110. As is shown in FIG. 22, the third access device region 140 is then coupled to a storage device 145. The storage device 145 can be a capacitor or other suitable storage device known in the art. In another embodiment, the second and third access device regions 135, 140 could be formed after formation of dielectric liner material 127 and the isolation region 120. In this embodiment, the dielectric liner material would not be formed on the second and third semiconductor regions 135, 140, as was shown in FIG. 13.

The isolation structure described above serves to reduce leakage from one vertical access device to another as well as from the vertical access device to the substrate. The isolation structure serves to have a fixed positive interface charge between the dielectric liner material and the isolation regions. In one embodiment, this fixed charge is between 1e12 and 5e12 cm$^{-2}$, more preferably, approximately 3e12 cm$^{-2}$. This interface charge serves to reduce the Band-Band tunneling, which reduces bit line leakage. The isolation structure also increases the effective base length for the parasitic path between adjacent devices and reduces bit line-to-bit line leakage. If desired to further reduce Band-Band tunneling, the intermediary material 129, shown in FIG. 11, may be selected to move the fixed positive interface charge from the surface of the semiconductor material and locate the fixed charge at the interface of the intermediary material 129 and the dielectric liner material 127, 127a, 127b, 127c. By reducing parasitic leakage as well as bit line leakage, the isolation structure will result in lower overall leakage and reduce power consumption of the device, in addition to allowing for higher device manufacturing density.

While various embodiments have been described herein, various modifications and changes can be made. As is understood by one of ordinary skill in the art, the disclosed process is not limited to construction of MOSFET devices. In other embodiments, the disclosed process may be utilized in the formation of other devices using semiconductor regions of the type described above including bipolar transistors. Accordingly, the disclosed embodiments are not to be considered as limiting as the invention is defined solely by the scope of the appended claims.

What is claimed as new and desired to be protected by Letters Patent of the United States is:

1. An isolation structure comprising:
    a trench in a first portion of a semiconductor substrate, the trench defining an area between adjacent first semiconductor regions, the first semiconductor regions having a first type of conductivity, each first semiconductor region being adjacent to a second semiconductor region of a vertical access device, the second semiconductor region having a second type of conductivity;

a dielectric liner material formed in the trench on the adjacent first semiconductor regions; and a dielectric material that fills the trench to form at least a portion of an isolation region such that only the dielectric material is provided between the dielectric liner material formed in the trench between the adjacent first semiconductor regions.

2. The isolation structure of claim 1, wherein the isolation region is further formed in a second portion of the semiconductor substrate residing below the first portion.

3. The isolation structure of claim 2, wherein the isolation region is formed in the second portion of the semiconductor substrate to extend beneath an adjacent first semiconductor region.

4. The isolation structure of claim 3, wherein the dielectric liner material is formed in contact with at least a portion of at least one adjacent first semiconductor regions.

5. The isolation structure of claim 4, wherein the dielectric liner material is formed in contact with at least a portion of at least one adjacent second semiconductor region.

6. The isolation structure of claim 5, wherein the dielectric liner material is formed in contact with at least a portion of at least one adjacent third semiconductor region and at least a portion of at least one adjacent fourth semiconductor region.

7. The isolation structure of claim 5, wherein the dielectric liner material is formed in contact at a junction where the first adjacent semiconductor region and the second semiconductor region contact.

8. The isolation structure of claim 4, wherein the dielectric liner material ends at a junction where the first semiconductor region and at least one adjacent second semiconductor region contact.

9. The isolation structure of claim 2, further comprising a bit line adjacent to and in electrical communication with the second semiconductor region.

10. The isolation structure of claim 9, wherein the bit line is formed such that the bit line is spaced from a junction where the first semiconductor region and the second semiconductor region contact.

11. The isolation structure of claim 9, wherein the bit line is formed such that the bit line terminates even with a junction where the first semiconductor region and the second semiconductor region contact.

12. The isolation structure of claim 9, wherein the bit line is formed with a height equal to a height of the second semiconductor region.

13. The isolation structure of claim 9, wherein the dielectric liner material is formed over the bit line.

14. The isolation structure of claim 9, wherein the dielectric liner material is not formed over the bit line.

15. The isolation structure of claim 9, further comprising an intermediary material formed adjacent to the bit line.

16. The isolation structure of claim 15, wherein the intermediary material is formed of at least one of silicon dioxide or hafnium oxide.

17. The isolation structure of claim 15, wherein the dielectric liner material is formed adjacent to the intermediary material.

18. The isolation structure of claim 15, wherein the intermediary material has a thickness of less than about 10 Å.

19. The isolation structure of claim 3, wherein the isolation region further comprises an oxide material formed in the trench.

20. The isolation structure of claim 3, further comprising a third semiconductor region formed adjacent the second semiconductor region, the third semiconductor region having a first dopant type.

21. The isolation structure of claim 20, further comprising a gate oxide formed adjacent the third semiconductor region.

22. The isolation structure of claim 21, further comprising a word line formed adjacent the gate oxide.

23. The isolation structure of claim 3, wherein the dielectric liner material comprises at least one of silicon nitride, silicon dioxide, or silicon oxynitride.

24. The isolation structure of claim 3, wherein the dielectric liner material has a thickness between 20 and 50 Å.

25. The isolation structure of claim 3, wherein the dielectric liner material comprises a material that provides a fixed interface charge of between about 1e12 and 5e12 $cm^{-2}$.

26. The isolation structure of claim 3, wherein the dielectric liner material serves to reduce band-band tunneling between adjacent first semiconductor regions.

27. A memory device comprising:
a plurality of storage devices; and
an array of vertical access devices, wherein each storage device is coupled to a corresponding vertical access device, the array comprising:
at least one trench in a first portion of a semiconductor substrate, the trench defining an area between adjacent first semiconductor regions of adjacent vertical access devices, the first semiconductor regions being doped to a first type of conductivity;
a dielectric liner material formed in the trench between the adjacent first semiconductor regions; and
an isolation region comprising a dielectric material that fills the trench such that only the dielectric material is provided between the dielectric liner material formed in the trench between the adjacent first semiconductor regions.

28. The memory device of claim 27, wherein the isolation region is further formed in a second portion of the semiconductor substrate resting below the first portion, the isolation region being adjacent the trench.

29. The memory device of claim 28, wherein the isolation region is formed in the second portion of the semiconductor substrate to extend beneath an adjacent first semiconductor region, the second portion being doped to a second type of conductivity.

30. The memory device of claim 29, wherein the dielectric liner material is formed in contact with at least a portion of the adjacent first semiconductor regions.

31. The memory device of claim 30, further comprising a second semiconductor region having a second type of conductivity adjacent to each of the first semiconductor regions, wherein the dielectric liner material is formed in contact with at least a portion of the second semiconductor regions.

32. The memory device of claim 31, wherein the dielectric liner material is formed in contact with a junction where the first semiconductor region and the second semiconductor region contact.

33. The memory device of claim 30, wherein the dielectric liner material ends at a junction where the first semiconductor region and the second semiconductor region contact.

34. The memory device of claim 31, further comprising a bit line in electrical communication with the second semiconductor region.

35. The memory device of claim 34, wherein the bit line is formed such that the bit line is spaced from a junction where the first semiconductor region and the second semiconductor region contact.

36. The memory device of claim 34, wherein the bit line is formed such that the bit line terminates even with a junction where the first semiconductor region and the second semiconductor region contact.

37. The memory device of claim 34, wherein the bit line is formed with a height equal to a height of the second semiconductor region.

38. The memory device of claim 34, wherein the dielectric liner material is formed over the bit line.

39. The memory device of claim 34, wherein the dielectric liner material is not formed over the bit line.

40. The memory device of claim 34, further comprising an intermediary material formed adjacent to the bit line.

41. The memory device of claim 40, wherein the intermediary material is formed of at least one of silicon dioxide or hafnium oxide.

42. The memory device of claim 40, wherein the dielectric liner material is formed adjacent to the intermediary material.

43. The memory device of claim 40, wherein the intermediary material has a thickness of less than about 10 Å.

44. The memory device of claim 29, wherein the isolation region further comprises an oxide material formed in the trench.

45. The memory device of claim 31, further comprising a third semiconductor formed adjacent each second semiconductor region and doped to a first dopant type.

46. The memory device of claim 45, further comprising a gate oxide formed adjacent the third semiconductor region.

47. The memory device of claim 46, further comprising a word line formed adjacent the gate oxide.

48. The memory device of claim 29, wherein the dielectric liner material comprises at least one of silicon nitride, silicon dioxide, or silicon oxynitride.

49. The memory device of claim 29, wherein the dielectric liner material has a thickness between 20 and 50 Å.

50. The memory device of claim 29, wherein each storage device comprises a capacitor.

51. The memory device of claim 29, wherein the dielectric liner material comprises a material that provides a fixed interface charge of between about 1e12 and 5e12 $cm^{-2}$.

52. The memory device of claim 29, wherein the dielectric liner material serves to reduce band-band tunneling between adjacent first semiconductor regions.

* * * * *

UNITED STATES PATENT AND TRADEMARK OFFICE
CERTIFICATE OF CORRECTION

| | | |
|---|---|---|
| PATENT NO. | : 8,633,564 B2 | Page 1 of 1 |
| APPLICATION NO. | : 13/310145 | |
| DATED | : January 21, 2014 | |
| INVENTOR(S) | : Kamal Karda et al. | |

It is certified that error appears in the above-identified patent and that said Letters Patent is hereby corrected as shown below:

On the title page, item (54) and in the Specification, in column 1, line 1, under "Title", delete "SEMICONDUTOR" and insert -- SEMICONDUCTOR --, therefor.

Signed and Sealed this
Twenty-fifth Day of March, 2014

Michelle K. Lee
*Deputy Director of the United States Patent and Trademark Office*